United States Patent [19]
Lum

[11] 3,978,401
[45] Aug. 31, 1976

[54] DISTORTION MEASUREMENT SYSTEM
[75] Inventor: Jack G. S. Lum, Sunnyvale, Calif.
[73] Assignee: Sound Technology, Inc., Campbell, Calif.
[22] Filed: Oct. 29, 1975
[21] Appl. No.: 626,758

Related U.S. Application Data
[62] Division of Ser. No. 509,118, Sept. 25, 1974.

[52] U.S. Cl. .............................. 324/57 N; 328/162
[51] Int. Cl.² ........................................ G01R 27/00
[58] Field of Search ...................... 324/57 N, 57 R;
328/162; 307/295; 325/363

[56] References Cited
UNITED STATES PATENTS
3,355,668  11/1967  Boensel et al. ............... 328/162 X
3,643,073  2/1972   Sawamura ..................... 324/57 R X
3,848,185  11/1974  Hentschel ..................... 324/57 R Primary Examiner—Stanley T. Krawczewicz
Attorney, Agent, or Firm—Flehr, Hohbach, Test, Albritton & Herbert

[57] ABSTRACT

A distortion measurement system for measuring distortion as low as .002% includes an ultra low distortion oscillator having a relatively fast response which is achieved by switching the time constant of the control loops of the oscillator during settling. The analyzer section included in the distortion system has a unique notch filter which provides low distortion. This is achieved by adding together two 90° all pass phase shifters. In addition, automatic tuning is provided by two feedback control loops; one is responsive to out-of-phase signals which controls the RC filter circuits of the phase shifters and the other responds to the in-phase signals which controls the output summing junction of the notch filter. Finally, a feedforward type of simultaneous tuning is accomplished by ganging the oscillator frequency adjustment with the analyzer.

10 Claims, 13 Drawing Figures

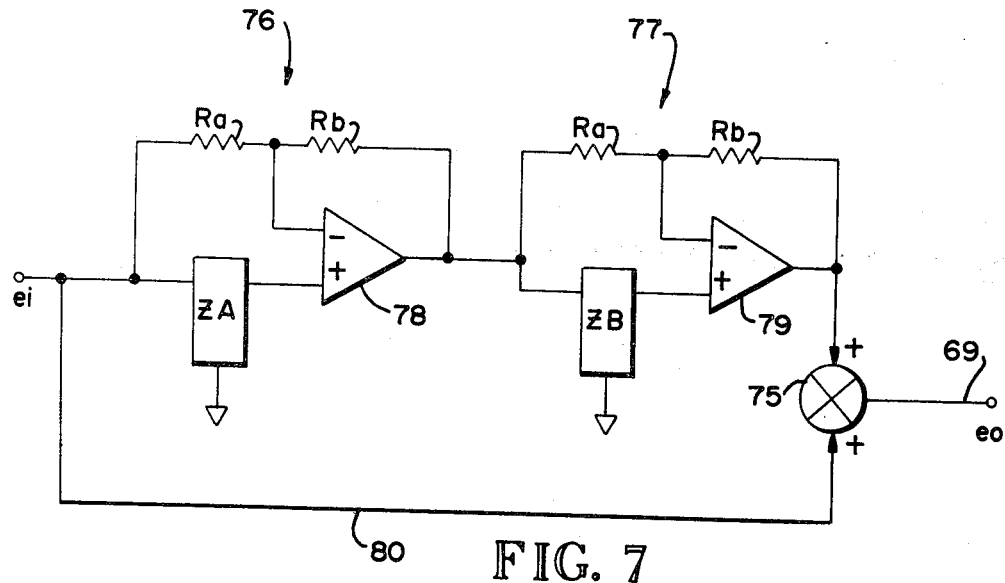
FIG. 7
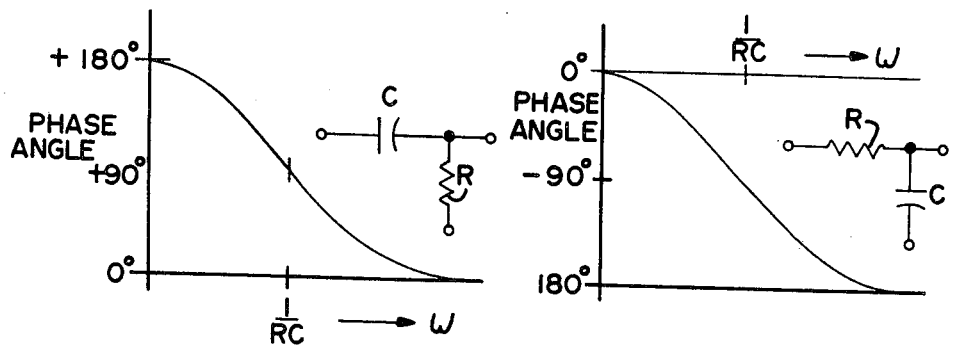
FIG. 8-A　　　FIG. 8-B

DISTORTION MEASUREMENT SYSTEM

This is a division, of application Ser. No. 509,118 filed Sept. 25, 1974.

BACKGROUND OF THE INVENTION

The present invention is directed in general to a distortion measurement system and more particularly to a system which includes an ultra low distortion oscillator which conceptually may also provide for improved amplitude control, includes a distortion analyzer which has an improved notch filter system, and includes a combination of such analyzer and oscillator forming the overall system where all system components effectively track together and provide for fast stabilization.

In a distortion measurement system which may find use in measuring the distortion of audio amplifiers, for example, it is desired to measure distortion down to .002%. Moreover, it is desired to accomplish this measurement with a system which is relatively fast and simple in operation. In other words, the system must be fully automatic in operation.

Moreover, in order to measure very low distortions such as .002% the system must, of course, include an oscillator which generates a test signal within that specification. This necessitates the use of an independent oscillator which itself has an improved distortion figure which has heretofore not been commercially available.

A typical prior art distortion analyzer is produced by Hewlett-Packard Corporation of Palo Alto, California, under Model No. 333. An automatic nulling circuit for the analyzer is shown by the U.S. Pat. No. 3,315,153 in the name of L. A. whatley assigned to Hewlett-Packard. In general, all distortion analyzers known to the applicant operate on the principle of selectively rejecting a fundamental frequency component and then measuring the remaining components which, of course, make up the distortion of the main waveform. Whatley is objectional in that it requires a minimum of three photocells which contributes excessive distortion. Also the tracking of time constants is critical.

Another notch filter type frequency selective network which may be used in a distortion analyzer is shown by Brault U.S. Pat. No. 3,270,213 assigned to Princeton Applied Research. The circuit disclosed here however is wholly different from the cascade technique of the present invention and is more complex in design.

In general, a classic problem in the design of a low distortion oscillator and distortion analyzer is that both components of the distortion measurement system must be varied over a wide frequency range in order to perform the necessary function of the system in measuring the distortion of signals of various frequencies; for example, over the audio range. To switch frequencies requires the switching of resistive-capacitive components. This introduces component variations because of the tolerances of such components. In order to compensate for such variations feedback adjustments are necessary. However, such feedback adjustments in turn introduce distortion thus defeating the entire purpose of providing a distortion measurement system.

Prior devices have attempted to meet the foregoing problems but have only partially done so. Most important no prior system can effectively measure in a simple and economical manner the low distortion which are now included in the specifications of modern receiver-amplifiers.

OBJECTS AND SUMMARY OF THE INVENTION

It is, therefore, an object of the present invention to provide an improved distortion measurement system.

It is another object of the invention to provide a system as above which includes improved oscillator and analyzer sections.

It is a further object of the invention to provide a system as above which does not require passive components of relatively high tolerances.

It is another object of the invention to provide a system as above which is simple to operate and relatively high speed in operation.

In accordance with the above objects there is provided a distortion measurement system for measuring the distortion of a signal of a predetermined frequency comprising an oscillator of the Wien bridge type including an amplifier having an output and input. Positive feedback means form two legs of the bridge and have frequency selective elements. Negative feedback means form the other two legs of the bridge. Analyzer means include notch filter means having frequency selective elements. Means are providing for ganging said frequency selective elements of said oscillator and analyzer means during changes in the predetermined frequency.

BRIEF DESCRIPTION OF THE DRAWINGS

FIG. 3A is an alternative embodiment of a portion of FIG. 3;

FIG. 7 is a block diagram illustrating in simplified form a portion of FIG. 6;

FIGS. 8A and 8B are curves useful in understanding FIG. 7;

DETAILED DESCRIPTION OF THE PREFERRED EMBODIMENT

Figure 1:
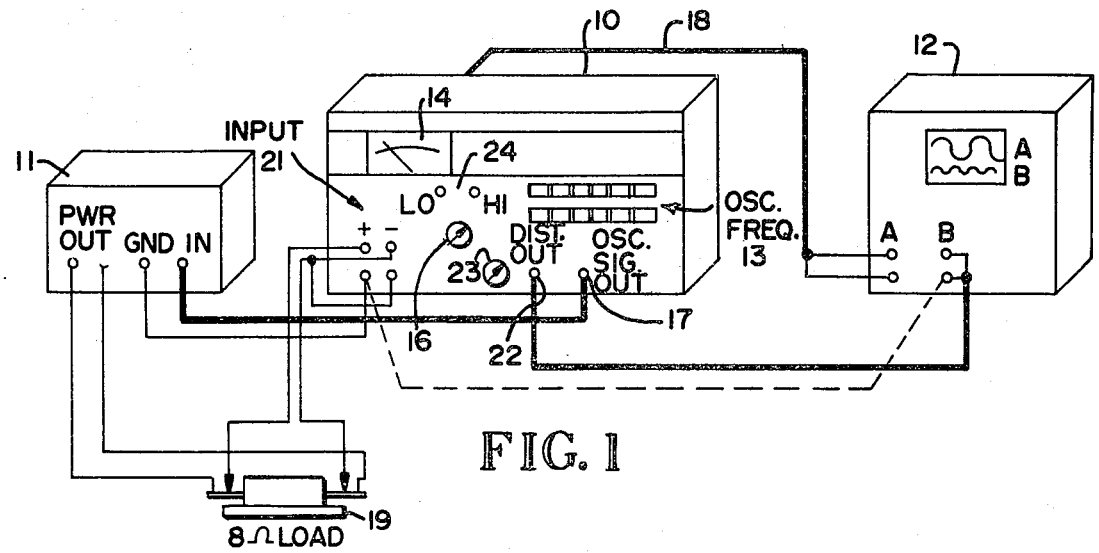
FIG. 1 is a cabling connection diagram showing how the distortion measurement system is utilized in practice.

FIG. 1 illustrates the distortion analyzer system which is contained in cabinet 10 as it would be used to measure the distortion of an amplifier 11. The oscilloscope 12 is for optional use. The distortion measurement system in essence combines an ultra low distortion oscillator, whose frequency is either varied by the push buttons 13 or programmed by an external input, with a high resolution automatic nulling distortion analyzer. Percent distortion is indicated on a meter 14 and visually displaced on scope 12 by the tracing B. The signal being analyzed is indicated by the tracing A. Meter 14 has several ranges as controlled by the distortion range switch 16. The oscillator output is provided on the coupling 17 and is coupled to the input of the amplifier 11. The power output of the amplifier 11 is connected to an 8 ohm load 19 and to the differential input terminals 21 of the distortion measurement system. The same signal is coupled to the A terminal of scope 12 by the cabling 18.

As discussed above, the analyzer portion of the system selects or notches out the oscillator frequency leaving only the distorting harmonic components and this is indicated in percent on meter 14 and also coupled out of the system through terminal 22 to the B input of scope 12. Various ground loops are also completed as indicated. A set level control 23 provides for standardizing of the distortion reading since the reading is a percent of a constant value.

As will be explained below, the distortion analyzer frequency is selected simultaneously with the oscillator frequency due to a mechanical ganging from the push buttons 13. This feature combined with the fulling automatic nulling circuitry of the analyzer provides for a rapid speed of operation.

Another feature of the system are the notch frequency indicators 24 designated LO and HI. These are useful when a source external to the built-in oscillator is being measured. The notch frequency lights facilitate tuning. When the LO light is lit, the notch frequency of the analyzer is low with respect to the incoming signal and when the HI light is lit it indicates that the opposite is true. The distortion analyzer is correctly turned when both lights are not illuminated.

OSCILLATOR

Figure 2:
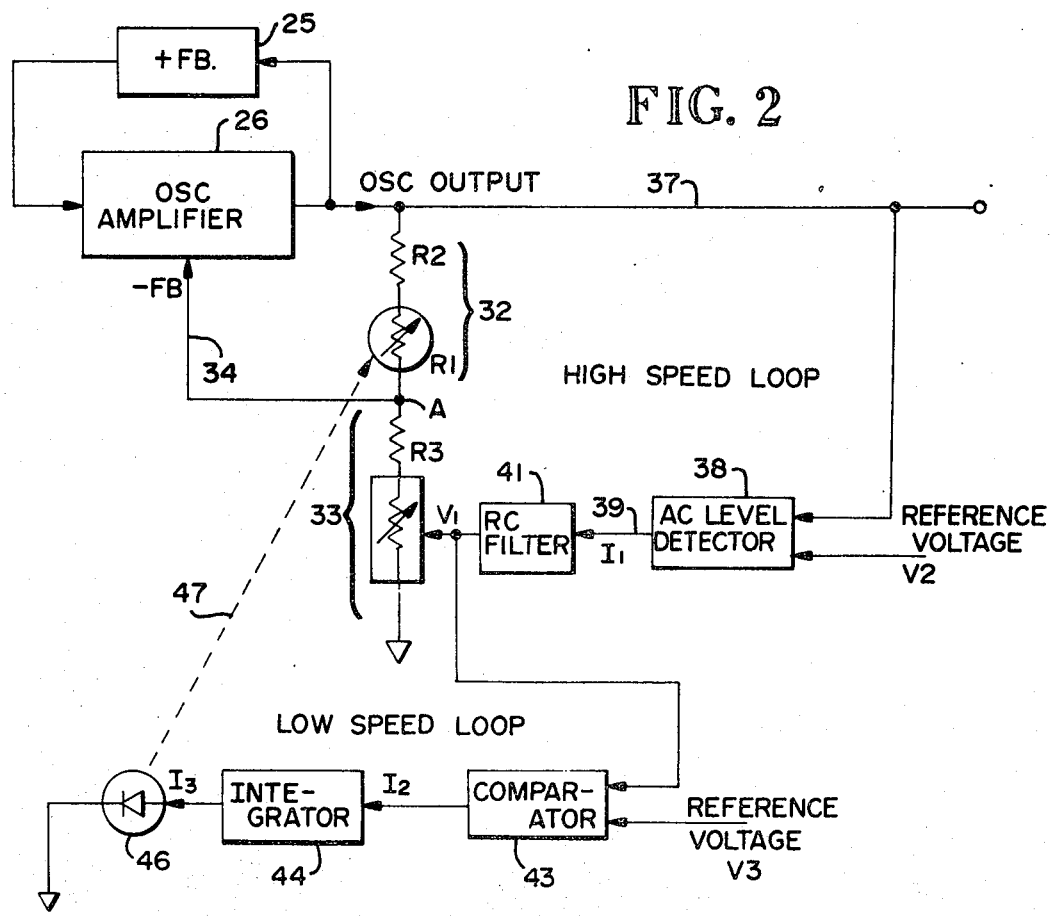
FIG. 2 is a simplified block diagram of the oscillator section of the present invention.
Figure 3:
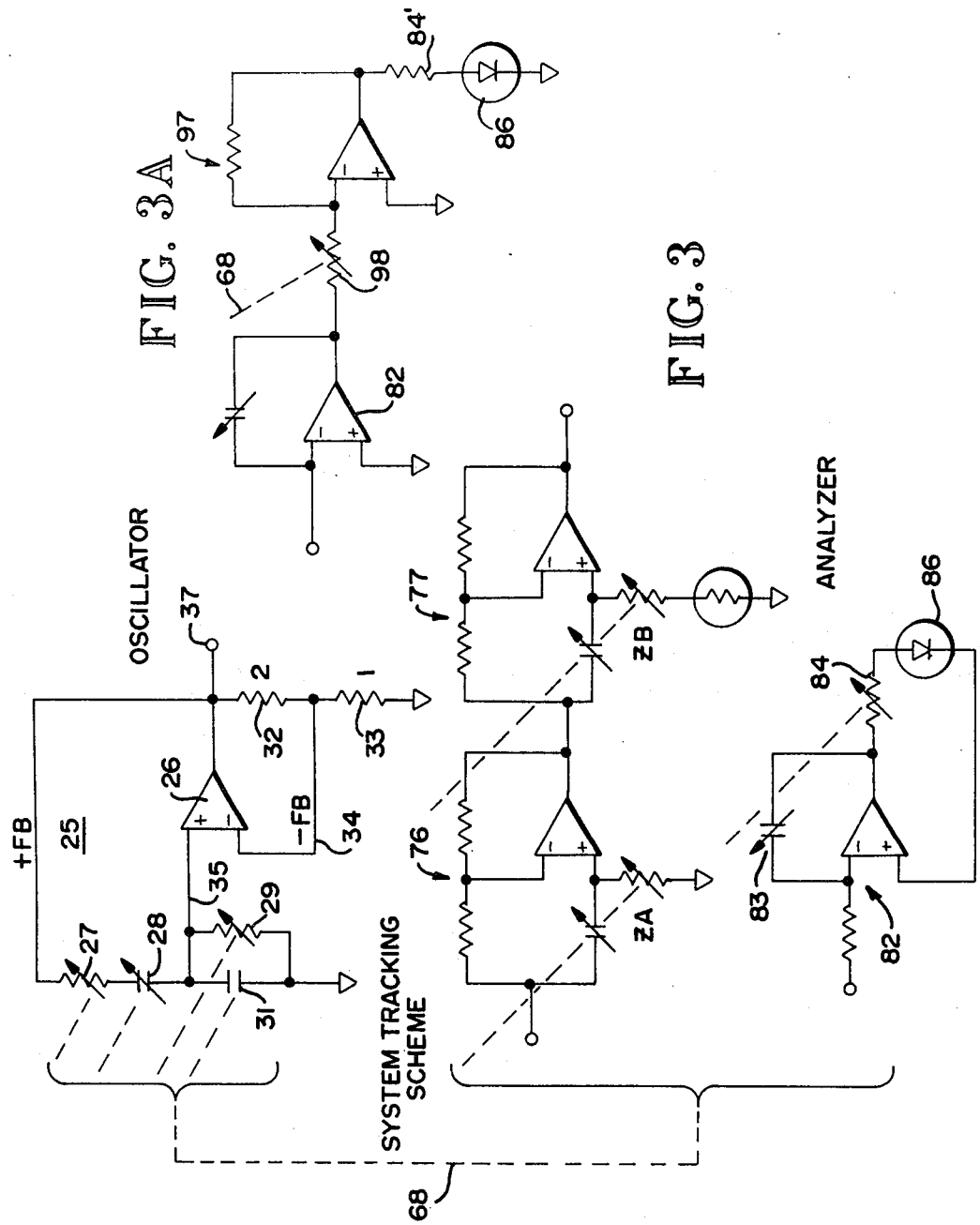
FIG. 3 is a circuit schematic illustrating the system tracking scheme between the oscillator and analyzer portions of the system.

Referring now to FIG. 2 and the upper portion of FIG. 3, there is illustrated a simplified block diagram of the oscillator portion of the system of the present invention. As discussed previously a classic problem in the design of a low distortion oscillator is that when components are switched to provide various frequencies, a large control range is required to compensate for tolerance variations in the passive RC components. This, however, causes undesirable distortion. As will be discussed below, the present oscillator solves the foregoing problem. In fact, such solution is applicable to any amplitude control system and is not restricted merely to oscillators.

Referring to FIGS. 2 and 3 the oscillator includes an oscillator amplifier 26 having a positive feedback loop 25 which is adjustable by the push buttons 13 (FIG. 1) to provide a desired frequency. Details of the oscillator are illustrated in FIG. 3 where the positive feedback loop includes a series RC circuit having a resistor 27 and a capacitor 38 and a parallel circuit with a resistor 29 and a capacitor 31 which is coupled to common. The midpoint of the two circuit portions is connected to the positive or non-inverting input terminal of amplifier 26, the negative inverting terminal being connected to negative feedback loop. Such loop includes series connected resistive portions 32 and 33 with their relative values of 2 to 1 indicated. Such negative feedback loop is necessary to stabilize the amplitude of oscillation.

The oscillator indicated in FIG. 3 is basically of the Wien bridge type which employs resistance and capacitance elements for frequency control in a bridge circuit. In this type of oscillator, the output is relatively free from harmonics and can be made to cover a wide frequency band. Moreover, the bridge circuit acts to discriminate against any frequency except that required to balance the bridge. It, therefore, has unusual frequency stability and is an ideal circuit for the present application. In a null condition, the positive feedback is exactly balanced by the negative feedback. The null occurs between line 34 to the negative input terminal of the amplifier and line 35 to the positive input. In other words, negative feedback elements 32 and 33 act as a precise voltage divider to determine the negative feedback ratio; thus elements 32 and 33 have relative values to 2 to 1. This matches the other two legs of the bridge 27, 28, and 29, 31.

Relating the desired change of frequency to the push button frequency adjustment shown in FIG. 1, the frequency range is varied by the adjustment of the value of capacitors 28 and 31 and within each range the resistors 27 and 29 are controlled.

Referring now specifically to FIG. 2, the oscillator output on line 37 is connected to an ac level detector 38 which monitors the output signal and produces a current I1 on line 39 whenever the signal amplitude is greater than the reference voltage V2. This, of course, serves as a peak detector. Active RC filter 41 smooths the current I1 and provides a bias voltage V1 to drive a voltage controlled resistor (VCR) 42. A comparator 43 compares the level of the bias voltage V1 against a reference voltage V3 and produces an output current I2 that is proportional to the difference between these two voltages. Integrator 44 integrates the comparator output current I2 continuously and produces an output current I3 which drives light emitting diode 46. This controls a light sensitive resistor R1 as indicated by the dashed line 47. Such light sensitive resistor is a portion of the negative feedback network of the oscillator as described in conjunction with FIG. 3, the light sensitive resistor R1 in series with resistor R2 constituting the resistive portion 32 and the resistor R3 and the voltage controlled resistor 42 forming the resistive portion 33. This feedback network provides a variable negative ratio in response to signals both from the RC filter 41 and light emitting diode 46.

The operation of the oscillator is as follows. When power is first applied to the system, there is no amplitude and therefore the output V1 of the filter is zero and the VCR 42 is at its lowest resistance. In the same instant, the output of integrator 44 is zero thus cutting off the drive to the light emitting diode 46 which causes element R1 to have a very high resistance. The condition will yield a very low negative feedback ratio to the oscillator, thus forcing it to start immediately. In other words, the positive feedback will be predominant. As the amplitude builds up on output line 37 and passes the reference voltage V2, I1 on line 39 from ac level detector 38 charges RC filter 41. This creates a large bias voltage V1 which will increase the resistance of the VCR 42 to tend to bring the amplitude of the oscillator downwards. At the same time comparator 43 also sees the buildup of V1 and when it is greater in magnitude than the reference V3 comparator 43 produces the current I2 which drives integrator 44 and light emitting diode (L.E.D.) 46. Photo sensitive element R1 then responds to the light signal to decrease its resistance and further tends to dampen the amplitude by increasing the negative feedback. This action continues until the oscillator output amplitude is equal to reference V2 and the VCR 42 bias voltage V1 equals the reference voltage V3.

If at any time the oscillator amplitude is lower or higher than the reference voltage V2, the ac level detector 38 will respectively drive or cut off its drive to RC filter 41 and VCR 42 to thereby bring the amplitude back to the reference level V2. The foregoing action takes place once per cycle to maintain a stable oscillation and is thus a high speed control loop. However, in accordance with the invention while the high speed control loop maintains a constant oscillator amplitude the low speed control loop provides a constant optimum bias for the VCR 42. Such loop is inherently slower because of the time change of the photosensitive element. Specifically, the bias V1 to the VCR is constantly monitored by comparator 43 against the reference voltage V3. Any difference in voltage levels will result in the current I2. This current is integrated continuously by integrator 44. Over a given period of time if there is an average net increase of VCR 42 bias V1 there will be an increase of drive current to L.E.D. 46 resulting in a decrease of resistance in photo sensitive element R1. When this occurs, VCR 42 is no longer required to have such a high resistance and hence the high bias voltage V1 for the VCR will gradually move back to its predetermined value, the reference voltage V3. The opposite occurs for a net decrease in VCR bias V1.

The control system as thus far described has the following characteristics:

1. fast starting—initial conditions at the instant power is applied will automaticaly provide a very low negative feedback since the resistance of R1 is initially high, thus ensuring an immediate start of oscillation;

2. fast settling—the high speed control loop which includes filter 41 and level detector 38 as well as VCR 42 provides a very short amplitude stabilization time;

3. flat frequency response—peak detector 38 and VCR 42 provide an extremely flat response versus frequency;

4. by use of a low speed control loop, the system maintains an optimum bias for the voltage controlled resistor 42. Since a principal source of distortion is a high bias on the VCR, the relatively low or optimun bias produces low distortion. Normally, a high bias may be required for a wide control range which as discussed above accommodates component variance. However, the present invention provides at the same time, low distortion with a relatively wide control range thus overcoming the classic design problem of control range versus distortion discussed above.

5. the use of close tracking or high precision and stable components is not necessary to achieve low distortion over a wide range of frequencies. The photosensitive element R1 which has very low distortion itself, will be able to provide a very wide control range without contributing significant distortion.

As thus far described, the oscillator of FIG. 2 produces a distortion of less than .05% in an operating range of, for example, from 100 hertz to 50 kilohertz. However, in order to provide for ultra low distortion of for example less than .001%, the following modifications as indicated in FIG. 4 are necessary.

In general such modifications provide for an initial short stabilization time and thereafter in a steady state long term mode emphasizes low distortion without sacrificing speed of response. Accordingly, VCR 42 is shunted by a resistor R5 whose value is selected to reduce distortion produced by VCR 42. However, since this shunting resistance necessarily reduces or limits the control range of VCR 42 a series switch 48 is provided to alternatively disconnect R5 and connect a resistor R4 which shunts both R3 and VCR 42. The value of R5 in practice is approximately the same as the operating resistance of VCR 42. Such parallel combination yields a resistance which is much smaller than the series resistor R3. The value of R4 is such that when the switch is moved to the NC or unactivated position, resistance between the node point A as indicated and the circuit common remains unchanged to thereby minimize transients and maintain stable oscillation. The specific relationship of the resistor values is R4 in parallel with $(R3 + R_{VCR})$ is equal to $(R3+R5)$ in parallel with $R_{VCR}$.

Thus, to summarize switch 48 may expand or limit the control range of the VCR 42. The value of R5 is such that it will reduce the VCR distortion contribution to a negligible amount and yet provide adequate control range when the oscillator is in the steady state condition. In other words, the switch may be initially placed in the NC position to provide for relatively fast settling of the circuit and then when steady state is reached, the NO position provides the necessary low distortion. This is all accomplished without the production of transients which might otherwise disturb the oscillation.

Figure 4:
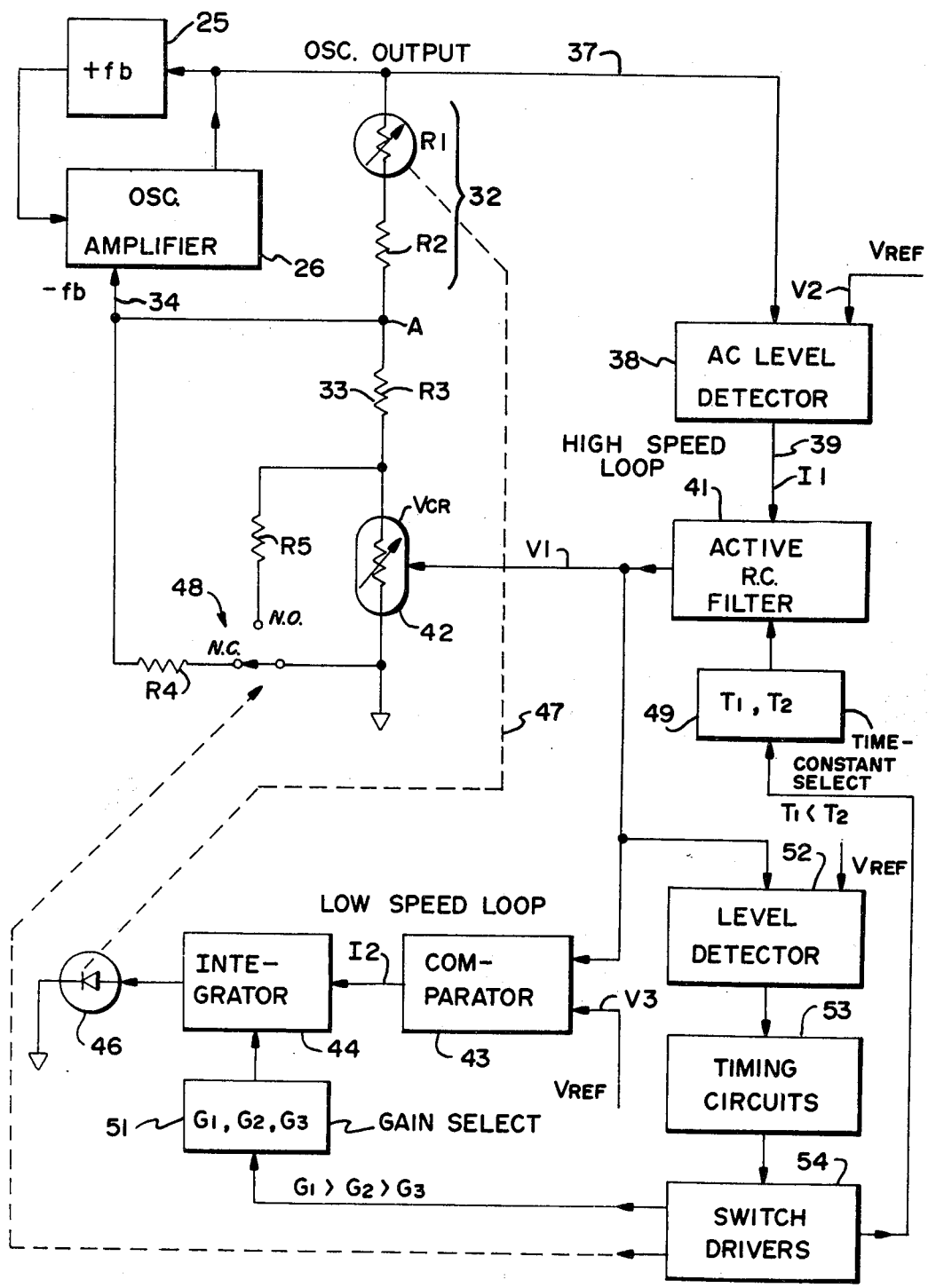
FIG. 4 is a block diagram illustrating a more complex arrangement of FIG. 2.

Another modification illustrated in FIG. 4 is that the RC filter 41 is now programmable through a select unit 49 with the time constants $\tau2$ and $\tau2$ with $\tau1$ being less than $\tau2$. The purpose of RC filter 41 is to reduce the ripple on the bias of VCR 42. However to achieve a high speed of operation, in other words a short stabilization time, initially a shorter time constant, $\tau1$, is provided. After VCR 42 has reached it optimum operating range, a switch is made to the longer time constant, $\tau2$ which reduces the ripple on the bias of the VCR 42 to a negligible amount so that no modulation of the resistance occurs which would otherwise cause distortion.

A gain select unit 51 which has three different gains of increasing value $G_1$, $G_2$ and $G_3$ drives the integrator 44 in the low speed control loop and serves to maintain the overall stability of the system as the control range of VCR 42 and the time constant of filter 41 is changed. For example, with a high gain the low speed control loop is somewhat unstable. However, this is not critical when the high speed loop is in the fast response mode and thus the high gain is useful in achieving a faster system response. A control system for varying select units 49 and 51 and switch 48 includes a level detector 52 which compares the bias voltage V1 to a reference voltage, the timing circuits 53 and the switch driver section 54.

The ultra low distortion system operates in the following manner. When power is first applied to the system, the bias voltage V1 is zero as level detector 52 sets switch 48 to the NC position and programs the active filter 41 to the short $\tau1$ time constant. This condition is essentially identical to the original relatively high distortion system and enables the oscillator to have a quick startup time as described before. This is the fast response mode. After a preset length of time, determined by timing circuits 53 which allows the bias V1 on VCR 42 to reach a steady state value the timing circuits 53 will drive switch 48 to the NO position and at the same time select a gain via selector 51 to cause the integrator 44 to have an intermediate gain G2. Resistor R5 is now shunting the VCR to minimize its control effectiveness. The system operates in this intermediate mode for a preset length of time during which the integrator 44 can make minor adjustments in drive to photo sensitive element R1 to compensate for any small mismatching in resistors R4 and R5. At the end of this intermediate period the timing circuit 53 which is part of the automatic control circuits programs the RC filter 41 to the longer time constant, $\tau 2$, and the integrator to have the lowest gain, $G_3$. With the filter 41 at $\tau 2$, the ripple on the VCR's bias is reduced to a negligible amount to again reduce distortion. Again the VCR 42 is operating with a close to ideal bias voltage. The low gain of the integrator 44 will enable the photosensitive element R1 to compensate for any slow drift of feedback network elements. This is, therefore, the ultra low distortion mode. In other words, the resistor R5 lessens the control range and for this sacrifice ultra low distortion is achieved. The gain of integrator 44 has also been decreased to maintain overall system stability in view of the corresponding change in VCR control range and filter time constant.

If in this low distortion mode the drift is too fast for integrator 44 to follow or if there is a sudden large disturbance to the steady state oscillation, the high speed control loop will try to immediately stabilize the oscillator. In doing so it will offset the steady state bias V1 to VCR 42. The level detector 52 of the automatic control circuit will detect this change in V1 and immediately reprogram the system to the fast response mode so that the system can make the necessary adjustments quickly. The automatic control circuits will then guide the system through the intermediate mode and finally settle on the ultra low distortion mode. Thus, to summarize the different modes in the fast response mode, $\tau 1$ is selected for the active RC filter 41, the gain $G_1$ for integrator 44 and switch 48 is in its NC condition; in the intermediate mode $\tau 1$ remains for filter 41 but the gain for integrator 44 is changed to $G_2$, a larger gain than $G_1$, and switch 48 is switched to the NO condition. In the final ultra low distortion mode filter 41 is switched to the $\tau 2$ state the gain select $G_3$ is utilized for integrator 44 with switch 48 remaining in the NO condition.

Figure 5:
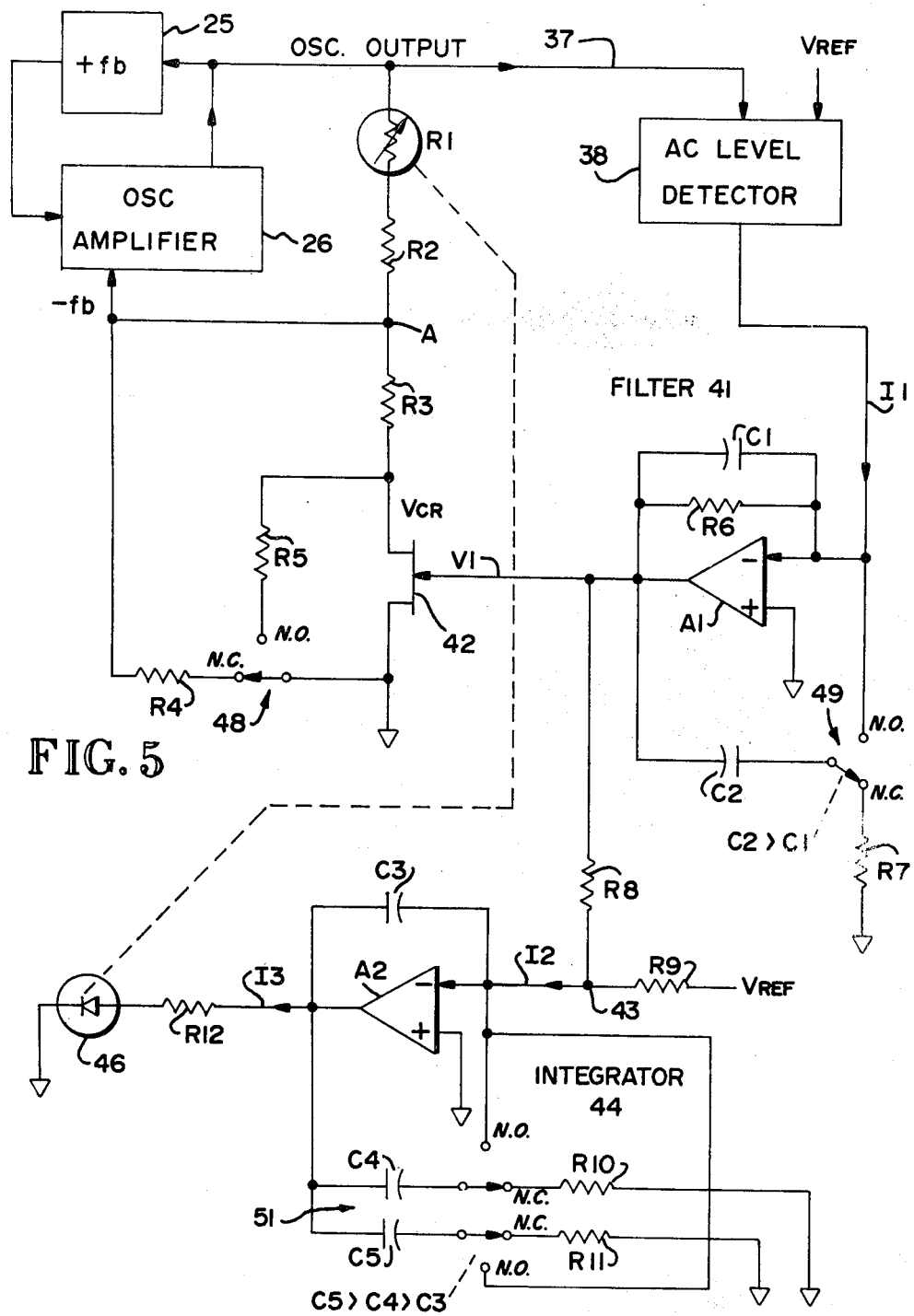
FIG. 5 is a somewhat more detailed circuit schematic of a portion of the oscillator of FIG. 4.

FIG. 5 is a more detailed circuit diagram of FIG. 4 with the automatic control circuits eliminated for simplicity. In integrator 44 the capacitors C4 and C5 are switched in and out to provide the various gains. In filter 41 again a switch is provided for the two time constants $\tau 1$ and $\tau 2$. The resistors with these two circuits R7, R10 and R11 are for the purpose of charging up the capacitors before they are placed across the amplifiers to minimize switching transients.

The voltage controlled resistor, VCR 42, is actually a field effect transistor which has the optimun bias of V1=V3 for low distortion.

ANALYZER

Figure 6:
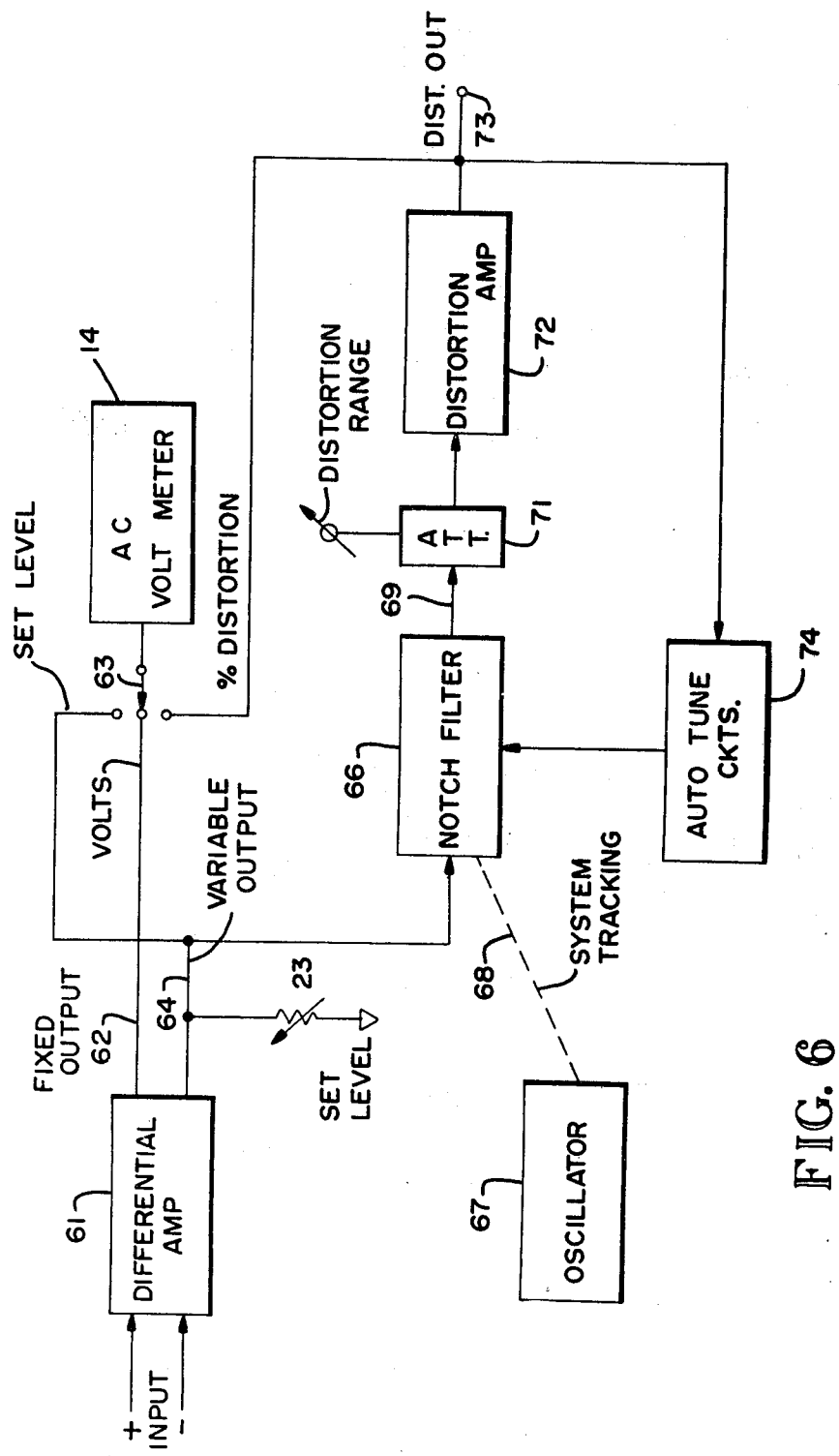
FIG. 6 is a block diagram illustrating the analyzer portion of the system of the present invention.

The analyzer section of the distortion measurement system of the present invention is illustrated in FIG. 6 and includes a differential amplifier 61 with an input which accepts the distorted output signal from the amplifier under test. Amplifier 61 has a fixed output 62 which when coupled to the ac voltmeter 14 (see FIG. 1) indicates the RMS voltage of the input signal. However, in order for the input signal to be compared to a constant reference voltage in order to measure, for example, db or percent distortion a set level potentiometer 23 adjusts the level of line 64 with the switch 63 in the set level position so that the meter 14 reads a set level value. Line 64 is coupled to a notch filter 66 which as will be discussed below has its frequency notch simultaneously adjusted or tracked with the frequency output of the oscillator section 67 of the distortion measurement system. The dashed line 68 indicates the system tracking coupling which in the present invention is mechanical ganging; in other words, the push buttons 13 referring to FIG. 1 are also coupled to the adjustable elements of notch filter 66. However, this could be electrically coupled or concurrently programmable by a central processing unit.

The output of notch filter 66 on line 69, which now has the fundamental frequency eliminated and only the distortion harmonics or components remaining, is passed through an adjustable attenuator 71 whose range is controlled by the distortion range switch 16 also found on the control panel of the instrument shown at FIG. 1. Attenuator 71 is coupled to a distortion amplifier 72 to provide the final distortion output signal at 73. The attenuator in effect changes the gain of amplifier 72. Such signal in addition to showing percent distortion on voltmeter 14, when switch 63 is moved to the proper position, also drives autotune circuits 74 to provide for proper tracking of the components of the notch filter 66. The autotune circuits provide a notch filter which is capable of rejecting the tuned signal by more than 100 decibels. Their purpose is automatically keeping the analyzer portion of the system in tune with the input signal. Distortion range switch 16 is ganged with elements in the autotune circuits as will be discussed below.

FIG. 7 illustrates the frequency selective portion of FIG. 6 in greater detail showing a simplified form of notch filter 66.

Notch filter 66 includes two 90° all pass phase shifters 76 and 77. Each phase shifter has minimum distortion in view of the single amplifiers 78 and 79. By connecting two +90° phase shifters or two −90° phase shifters in series and summing the signals at 75 with an in-phase signal on line 80 a notch filter is thereby formed. FIGS. 8A and 8B illustrate the characteristics of +90° and −90° phase shifters respectively where the selected frequency is determined by 1/RC of the Z network indicated; all offset frequencies are shifted a different degree than 90°.

The $Z_A$ and $Z_B$ networks are connected between the input and the noninverting (+) terminal of the differential amplifiers 78, 79. The $R_a$ resistors are respectively connected between the input and the inverting (−) input of each amplifier. Resistors $R_b$ are of the same value as $R_a$ and are respectively connected between the output and the inverting (−) terminal of the respective amplifiers.

The transfer function for an individual phase shifter with a Z configuration to produce a +90° phase shift at the fundamental frequency as shown in FIG. 8A is $$\frac{e_0}{e_i}(j\omega) = \frac{j\omega RC - \frac{R_b}{R_a}}{j\omega RC + 1}$$

$$\text{for } R_a = R_b \quad \frac{e_0}{e_i}(j\omega) = \frac{j\omega RC - 1}{j\omega RC + 1}$$

From the foregoing the magnitude for all frequencies is equal to one or a constant. This design is therefore an all pass circuit. The phase angle is $180° - 2\tan^{-1}\omega RC$.

Similarly, a Z configuration of −90° shown in FIG. 8B has a transfer function which is a negative of the foregoing.

When two phase shifters of like signs are cascaded to form a notch filter the transfer function is $$\frac{e_0}{e_i}(j\omega) = 2\frac{1 - AB\omega^2}{(1 - AB\omega^2) + j\omega(A+B)}$$

where $A = RC$ of $Z_A$ and $B = RC$ of $Z_B$.

The notch frequency $\omega_0$ is $1/\sqrt{AB}$ and Q is $\sqrt{AB}/A+B$.

Since the tuned frequency is equal to $1/\sqrt{AB}$ and the circuit Q is equal to $\sqrt{AB}/A+B$, one can conclude that:

1. For frequency tuning, the two time constants A and B need not be in close tracking to each other. In fact, one can be fixed while the other time constant varies to tune frequencies having a range of 4 to 1.

2. Circuit Q is relatively insensitive to the mistracking of the two time constants, A and B. If the two were mismatched by a factor of 4 to 1, Q will be .4 instead of .5. This is only a 20 percent change.

3. The filter has a constant response in the passband; independent of time constant tracking and Q variations as illustrated by the above transfer function.

Figure 9:
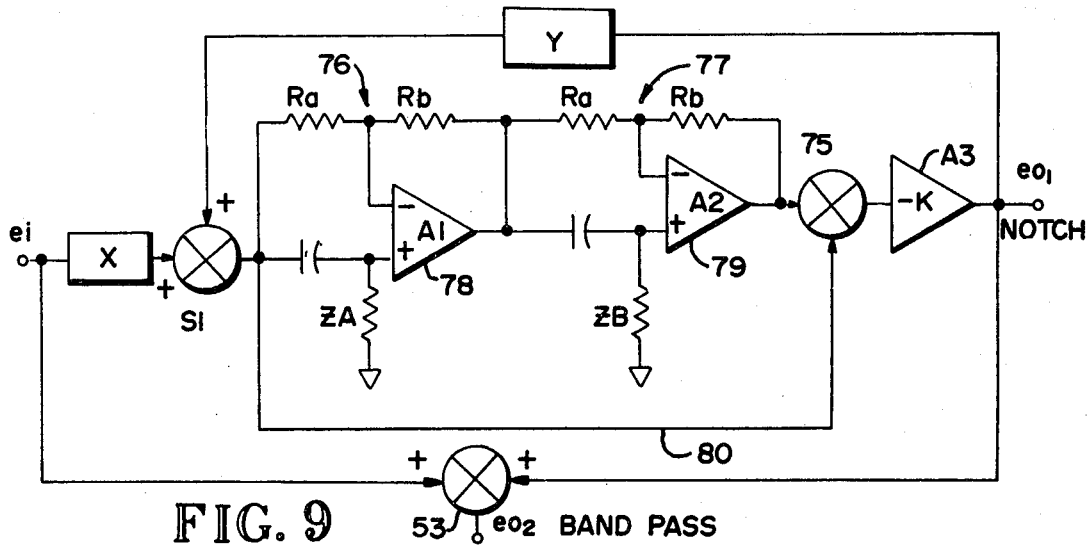
FIG. 9 is a modified form of FIG. 7.

A frequency selective system with Q multiplication using the basic frequency selective circuit of FIG. 7 is shown in FIG. 9. The output response of this system at $e_{01}$ is still a notch. However, summing the input and output at $S_1$ also yields a bandpass response at $e_{02}$.

The system consists of the basic frequency selective circuit followed by an inverting amplifier $A_3$ with gain equal to K. The output signal of this inverting amplifier is fed back to a summer, $S_1$, through a flat response network, Y. Another flat response network X is connected between the input signal ($e_i$) and summer ($S_1$). The output of summer $S_1$ is connected to the input of the basic frequency select circuit.

The transfer function for the notch output is $$\frac{e_{01}}{e_i}(S) = -\frac{\frac{2XK}{2YK+1}(S^2 + \frac{1}{AB})}{S^2 + (\frac{A+B}{AB})(\frac{1}{2YK+1})S + \frac{1}{AB}}$$

Notch frequency, $$\omega_0 = \frac{1}{\sqrt{AB}}; \quad Q = \frac{\sqrt{AB}}{A+B}(2YK+1)$$

Q is increased by a factor $(2YK+1)$.

For the alternative bandpass embodiment the bandpass transfer function is $$\frac{e_{02}}{e_i}(S) = \frac{\frac{A+B}{AB}(\frac{1}{2YK+1})S}{S^2 + (\frac{A+B}{AB})(\frac{1}{2YK+L})S + \frac{1}{AB}}$$

The resonant frequency, $$\omega_r = \frac{1}{\sqrt{AB}}; \quad Q = \frac{\sqrt{AB}}{A+B}(2YK+1)$$

Figure 10:
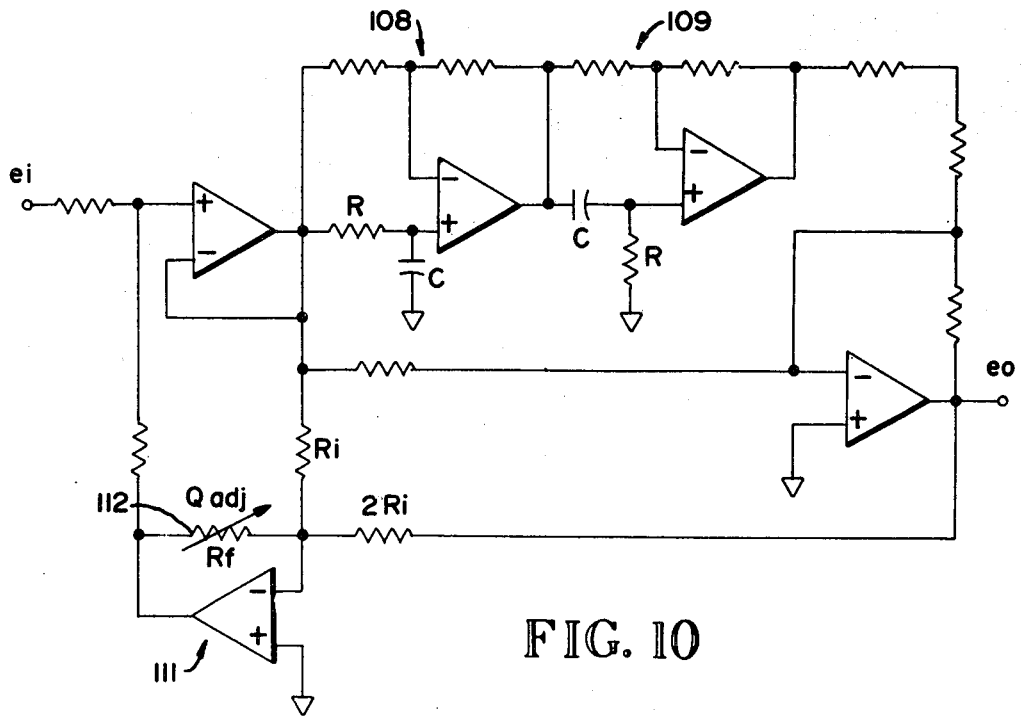
FIG. 10 shows an alternative embodiment of FIG. 9.

Figure 10 illustrates a practical embodiment of a bandpass filter with variable Q. It is an −90° phase shifter 108 and a +90° phase shifter 109. Operational amplifier 111 includes Q adjustment 112. The transfer function of the circuit is $$\frac{e_0}{e_i}(S) = -\frac{2RC_S(\frac{1}{K+1})}{(RC_S)^2 + 2(\frac{1}{K+1})RC_S + 1}$$

where $$K = \frac{R_f}{R_i} \text{ and } Q = \frac{K+2}{4}.$$

The notch filter system of FIG. 9 is very desirable in the design of a harmonic distortion analyzer, where the self-induced residual distortion must be low, for the following reasons.

1. There is a minimum number of amplifiers. Only three amplifiers, that is 78, 79 and $A_3$, need be used. Distortion from the amplifiers is therefore minimized.

2. The phase shifters 76, 77 are operating on low signal levels. Feedback networks X and Y effectively reduce the signal seen by the active phase shifters. Distortion is minimized because of the decrease in voltage level.

3. The distortion contribution from the phase shifters is reduced since only half the signal is passing through the phase shifters; the other half is passing through a passive branch and they sum together at $S_2$.

Figure 11:
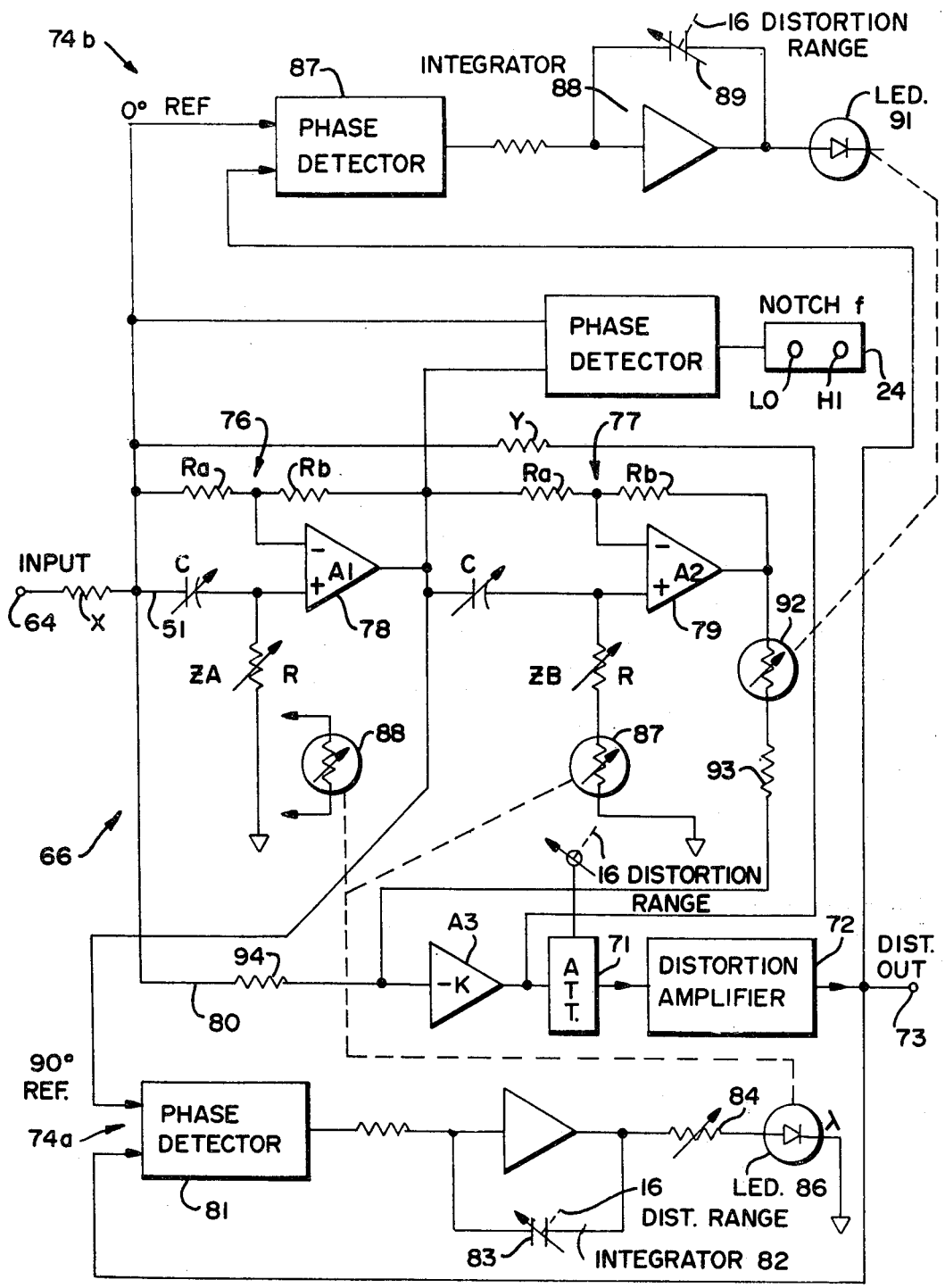
FIG. 11 is a more detailed circuit schematic of FIG. 6.

FIG. 11 illustrates the notch filter 66, attenuator 71, distortion amplifier 72 and autotune circuit 74 of FIG. 6 in greater detail; also the form of the notch filter is that of FIG. 9.

Portion 74a of the automatic tuning system includes the phase detector 81 which is driven by a 90° reference signal from the output of amplifier 78; that is, the signal in view of the 90° phase shift characteristic of shifter 76 of the notch filter is 90° from the input on 64. This acts as a reference to the distortion output 73 which is coupled to the memory or integrating circuit 82. Phase detector 81 continuously checks the system output for an out-of-phase signal (defined as a signal whose phase angle is not equal to zero degrees or ± 180°) and such out-of-phase signal will cause phase detector 81 to produce an output thereby charging integrator 82. Integrator 82 is of the Miller type and includes the feedback capacitor 83 adjusted by the distortion range switch 16. Its output is coupled by a variable resistor 84 to a light emitting diode 86 and thence back to the inverting terminal. LED 86 drives the photosensitive elements 87 and 88 to keep the entire system in tune. A frequency change in the input signal will restart this automatic tuning process. As illustrated, however, photosensitive element 88 is not actually in the circuit but is optional since the RC elements of $Z_A$ and $Z_B$ need not have close tracking. However, photosensitive element is in the RC circuit $Z_B$ of the phase shifter 77. The reason for the foregoing is that as discussed above both notch frequency and Q are a product of $Z_A$ and $Z_B$. Thus, an error in the A shifter can be compensated by the B shifter with no undesired side effects.

It should also be noted that if element 88 is added to the RC circuit $Z_A$, the shifter 76 will no longer produce exactly 90° at the input frequency and thus the 90° reference input to phase detector 81 must be provided by a separate 90° phase shifter coupled to input 64.

Automatic tuning circuit portion 74b provides additional rejection of the tuned signal by more than 100 decibels. Again the portion 74b includes a phase detector 87 which however is coupled to a zero degree reference signal from input 64. The detector drives Miller integrator 88 whose distortion range is controlled by switch 16 varying feedback capacitor 89. The integrator drives LED 91. The light emitting diode 91 in turn drives a photosensitive element 92 in the output of notch filter 66. Such output is coupled through a resistor 93 to a summing junction $S_2$ which also sums variable input 64 through a second resistor 94.

In operation phase detector 87 will check the system output for an in-phase signal. Such signal will cause the phase detector to produce an output and an out-of-phase signal will yield no response. Any output signal will be integrated by integrator 88 which in turn will drive the light emitting element 91. Photosensitive element 92 in response to this light signal will change its resistance in such a direction as to cause a reduction in the in-phase signal. The process continues until the in-phase magnitude reaches zero. when this occurs, integrator 88 because of its memory characteristic will maintain a constant drive to light emitting element 91 to keep the amplitude nulled.

Thus, there are two control loops 74a and 74b working together which will constantly keep the entire system in tune.

It should be noted that photosensitive unit 103 could alternatively be in series with resistor 94. Because of the all pass response of phase shifters 76, 77, irrespective of mistracking, when the $Z_A$ and $Z_B$ components are switched to provide another desired notch frequency, the range of adjustment of loop 74b is small. Feedback control correction is required only to correct amplitudes for slight inherent imperfections in the filter circuit. Thus, distortion is minimized.

A wide capture range of the automatic tuning circuit is also made possible by the foregoing relative immunity of the filter to mistracting of the time constants. Specifically, photosensitive element 87 may have a large control range since mismatching of the time constants A and B of $Z_A$ and $Z_B$ affects Q very little as discussed above. Also no extra control range is needed by photosensitive element 92 to compensate because of the all pass nature of the phase shifters.

As discussed above, since normally with no variable element 88 in the RC circuit $Z_A$ of shifter 76 the output of amplifier 78 is always shifted 90°, a phase detector 96 may use this 90° signal as a reference signal which when compared with the variable input signal 64 drives the notch frequency indicator 24. Such indicator is merely a pair of diodes which when as discussed above an input frequency from other than the oscillator of the system is used indicates whether such frequency is higher or lower than the notch frequency.

Nulling or automatic tuning is also completely automatic for all distortion ranges. In prior art devices it was necessary to manually null before the automatic mode could be initiated. In the present invention, the distortion range switch 16 is ganged to attenuator 71 and integrator capacitors 83 and 89. Thus, a reduction in overall gain due to an increase in attenuation at 71, which would lower the gain of the autotune loops 74a, b, is compensated for by increasing the gain of the respective integrators 82, 88. A constant overall gain is thereby maintained.

Still referring to FIG. 11, as the notch frequency of filter 66 is varied the R of $Z_B$ is chosen to provide a relatively constant voltage across photocell 87 for lower distortion. This is achieved by providing a fixed resistive ratio between photocell 87 and R since it can be assumed that the voltage level of the input to amplifier 79 is constant. Accordingly, predetermined values of R are computed for each frequency by use of $$\omega_o = \frac{1}{\sqrt{AB}}$$

where $\omega_o$ is the notch frequency and A and B the time constants of $Z_A$ and $Z_B$. The autotune circuits 74a, b will, of course, move the resistance of photocell 87 to achieve the selected $\omega_o$ and this resistance will be a fixed ratio with R of $Z_B$.

FIG. 3 illustrates the system tracking scheme which provides for close tracking between the oscillator and analyzer portions. The phase shifters 76 and 77 have their RC portions $Z_A$ and $Z_B$ ganged by dashed line 69 to the oscillator. In addition, variable resistor 84 of integrator 82 is also coupled to the system tracking scheme in order to maintain a constant voltage at the integrator output as the frequency is changed to maintain the speed of the circuit; that is, if such were not the case, the integrator 82 would take an excessive time interval to move. Thus, this effectively changes the drive to light emitting diode 86 while at the same time not requiring the integrator voltage to change. An alternative embodiment is the circuit of FIG. 3A which interposes a variable amplifier 97 between LED 86 and the integrator 82. Here variable resistor 98 is ganged to 68. The system tracking scheme illustrated in FIG. 3 is in general terms a type of feedforward system where when it is decided to change the oscillator frequency conditions the analyzer to prepare it for accepting the new frequency. Thus, speed of the system is enhanced.

Thus, the present invention has provided an improved distortion measurement system in which both improved oscillator and analyzer portions uniquely cooperate.

I claim:

1. A distortion measurement system for measuring the distortion in a signal of a predetermined frequency comprising: an ultra low distortion oscillator having frequency selective elements; analyzer means including notch filter means having frequency selective elements and a constant response in the passband; and means for ganging said frequency selective elements of said oscillator and analyzer means during changes in said predetermined frequency.

2. A system as in claim 1 where said analyzer means includes integration means said ganging means being coupled to said integration means to provide for a rapid adjustment when said predetermined frequency is changed.

3. A system as in claim 1 where said notch filter means includes two cascaded all pass phase shifter means of 90° each.

4. A system as in claim 3 where each of said phase shifter means includes frequency selective elements having respective time constants of A and B and a notch frequency proportional to $1/\sqrt{AB}$ whereby for frequency tuning said time constants need not closely track each other.

5. A distortion measurement system for measuring the distortion in a signal of a predetermined frequency comprising: an oscillator of the Wien bridge type including an amplifier having an output and input, positive feedback means forming two legs of the bridge and having frequency selective elements, negative feedback means forming the other two legs of the bridge; analyzer means including notch filter means having frequency selective elements; and means for ganging said frequency selective elements of said oscillator and analyzer means during changes in said predetermined frequency.

6. A distortion measurement system for measuring the distortion in a signal of a predetermined frequency comprising: an ultra low distortion oscillator having frequency selective elements; analyzer means including notch filter means having frequency selective elements and a constant response in the passband said notch filter means including means for automatically tuning said filter means to said predetermined frequency despite component variations comprising, a first feedback control loop responsive to out-of-phase signals for varying said frequency selective elements of said notch filter means, a second feedback control loop responsive to in-phase signals for controlling the summing of said input to said output and means for ganging said frequency selective elements of said oscillator and analyzer means during changes in said predetermined frequency.

7. A system as in claim 6 where said first and second loop include integrating-amplifier means and including variable amplifier means coupling said output of said filter means to both of said loops and means for ganging said variable amplifier means with both of said integrating-amplifier means for varying the amplification of such integrating-amplifier means inversely to the gain of said variable amplifier means whereby automatic tuning is achieved for all distortion ranges.

8. A system as in claim 6 where said first loop includes integrating-amplifier means and a light source driven by said integrating-amplifier means for feeding back a signal to at least one of said frequency selective elements of said notch filter means.

9. A system as in claim 8 including a variable resistor in series with said light source and integrating-amplifier means and connected to said ganging means for providing a change in drive current to said light source when said predetermined frequency is changed whereby no adjustment of said integrator-amplifier means is necessary.

10. A system as in claim 8 including a variable amplifier in series with said light source and integrating-amplifier means and connected to said ganging means for providing a change in drive current to said light source when said predetermined frequency is changed whereby no adjustment of said integrator-amplifier means is necessary.

* * * * *